United States Patent
Akaike et al.

(10) Patent No.: US 8,110,451 B2
(45) Date of Patent: Feb. 7, 2012

(54) METHOD FOR MANUFACTURING LIGHT EMITTING DEVICE

(75) Inventors: Yasuhiko Akaike, Kanagawa-ken (JP); Ryo Saeki, Fukuoka-ken (JP); Yoshinori Natsume, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 12/544,353

(22) Filed: Aug. 20, 2009

(65) Prior Publication Data
US 2010/0203659 A1    Aug. 12, 2010

(30) Foreign Application Priority Data
Feb. 10, 2009  (JP) .................................. 2009-028908

(51) Int. Cl.
*H01L 21/335* (2006.01)
(52) U.S. Cl. ................ 438/143; 438/158; 257/E21.318; 257/E21.414
(58) Field of Classification Search .................. 438/143, 438/158; 257/E21.318, E21.414
See application file for complete search history.

(56) References Cited

U.S. PATENT DOCUMENTS

| 5,234,153 | A | 8/1993 | Bacon et al. |
| 6,319,778 | B1 | 11/2001 | Chen et al. |
| 6,465,809 | B1 | 10/2002 | Furukawa et al. |
| 6,815,312 | B2 | 11/2004 | Furukawa et al. |
| 7,217,635 | B2 | 5/2007 | Furukawa et al. |
| 7,364,982 | B2 | 4/2008 | Furukawa et al. |
| 7,420,218 | B2 * | 9/2008 | Nagai ............................ 257/98 |
| 2004/0019424 | A1 | 1/2004 | Beauerle et al. |
| 2006/0199353 | A1 * | 9/2006 | Kub et al. ..................... 438/455 |
| 2007/0181895 | A1 * | 8/2007 | Nagai ............................ 257/98 |
| 2007/0194325 | A1 | 8/2007 | Sung et al. |
| 2008/0035949 | A1 | 2/2008 | Fudeta et al. |
| 2008/0073665 | A1 | 3/2008 | Slater et al. |
| 2008/0210971 | A1 | 9/2008 | Donofrio et al. |
| 2008/0230799 | A1 * | 9/2008 | Wang et al. ..................... 257/99 |
| 2008/0283819 | A1 | 11/2008 | Konno |
| 2008/0308827 | A1 | 12/2008 | Furukawa et al. |

FOREIGN PATENT DOCUMENTS

| JP | 2004-296846 | 10/2004 |
| JP | 2005-019424 | 1/2005 |
| JP | 2006-332610 | 12/2006 |

OTHER PUBLICATIONS

European Search Report for 09010983.6 Mailed May 25, 2010.

* cited by examiner

*Primary Examiner* — Alexander Ghyka
*Assistant Examiner* — Stanetta Isaac
(74) *Attorney, Agent, or Firm* — Turocy & Watson, LLP (57) ABSTRACT

A method for manufacturing a light emitting device, includes: forming a first multilayer body including a first substrate, a first semiconductor layer provided on the first substrate and having a light emitting layer, and a first metal layer provided on the first semiconductor layer; forming a second multilayer body including a second substrate having a thermal expansion coefficient different from a thermal expansion coefficient of the first substrate, and a second metal layer provided on the second substrate; a first bonding step configured to heat the first metal layer and the second metal layer being in contact with each other; removing the first substrate after the first bonding step; and a second bonding step configured to perform, after the removing, heating at a temperature higher than a temperature of the first bonding step.

19 Claims, 8 Drawing Sheets

METHOD FOR MANUFACTURING LIGHT EMITTING DEVICE

CROSS-REFERENCE TO RELATED APPLICATIONS

This application is based upon and claims the benefit of priority from the prior Japanese Patent Application No. 2009-028908, filed on Feb. 10, 2009; the entire contents of which are incorporated herein by reference.

BACKGROUND OF THE INVENTION

1. Field of the Invention

This invention relates to a method for manufacturing a light emitting device.

2. Background Art

Semiconductor light emitting devices capable of emitting visible light including blue to red light can be widely used in such applications as illumination lamps, displays, and traffic signals. Such light emitting devices with high brightness can find wider application in light sources replacing fluorescent lamps and incandescent bulbs. Furthermore, reduction of operating current facilitates achieving low power consumption.

Here, in a light emitting device which uses a substrate made of e.g. GaAs having a bandgap wavelength of generally 870 nm, visible light emitted from the light emitting device and having emission wavelengths of 700 nm or less is absorbed by the substrate, causing the problem of decreased brightness.

If the substrate is made of e.g. GaP having a bandgap wavelength of generally 550 nm, optical absorption by the substrate can be reduced for visible light having longer wavelengths, which facilitates increasing the brightness. However, the lattice constant of InGaAlP-based semiconductors capable of emitting visible light in the wavelength range from yellow-green to red differs from the lattice constant of GaP by as large as several %, which makes it difficult to directly form an InGaAlP-based light emitting layer with low crystal defect density on a GaP substrate.

JP-A 2005-019424(Kokai) discloses a technique related to a method for manufacturing a light emitting device by wafer bonding. In this technique, a substrate and a light emitting layer section are bonded via a metal layer. Here, a diffusion blocking semiconductor layer is provided to prevent metal diffusion from the metal layer into the light emitting layer, thereby preventing decrease in light emission characteristics.

However, it is difficult to achieve good wafer bonding characteristics while preventing cracking of the substrate in the heat treatment step for substrate lamination.

SUMMARY OF THE INVENTION

According to an aspect of the invention, there is provided a method for manufacturing a light emitting device, including: forming a first multilayer body including a first substrate, a first semiconductor layer provided on the first substrate and having a light emitting layer, and a first metal layer provided on the first semiconductor layer; forming a second multilayer body including a second substrate having a thermal expansion coefficient different from a thermal expansion coefficient of the first substrate, and a second metal layer provided on the second substrate; a first bonding step configured to heat the first metal layer and the second metal layer being in contact with each other; removing the first substrate after the first bonding step; and a second bonding step configured to perform, after the removing, heating at a temperature higher than a temperature of the first bonding step.

According to an aspect of the invention, there is provided a method for manufacturing a light emitting device, including: forming a first multilayer body including a first substrate made of one of GaAs, GaP, and SiC, a first semiconductor layer provided on the first substrate and having a light emitting layer, and a first metal layer provided on the first semiconductor layer; forming a second multilayer body including a second substrate having a thermal expansion coefficient different from a thermal expansion coefficient of the first substrate and made of one of Si, Ge, and SiC, and a second metal layer provided on the second substrate; a first bonding step configured to heat the first metal layer and the second metal layer being in contact with each other; removing the first substrate after the first bonding step; and a second bonding step configured to perform, after the removing, heating at a temperature higher than a temperature of the first bonding step.

According to an aspect of the invention, there is provided a method for manufacturing a light emitting device, including: forming a first multilayer body including a first substrate made of sapphire, a first semiconductor layer provided on the first substrate and having a light emitting layer, and a first metal layer provided on the first semiconductor layer; forming a second multilayer body including a second substrate having a thermal expansion coefficient different from a thermal expansion coefficient of the first substrate and made of one of Si, Ge, and SiC, and a second metal layer provided on the second substrate; a first bonding step configured to heat the first metal layer and the second metal layer being in contact with each other; removing the first substrate after the first bonding step; and a second bonding step configured to perform, after the removing, heating at a temperature higher than a temperature of the first bonding step.

DETAILED DESCRIPTION OF THE INVENTION

Embodiments of the invention will now be described with reference to the drawings.

Figure 1:
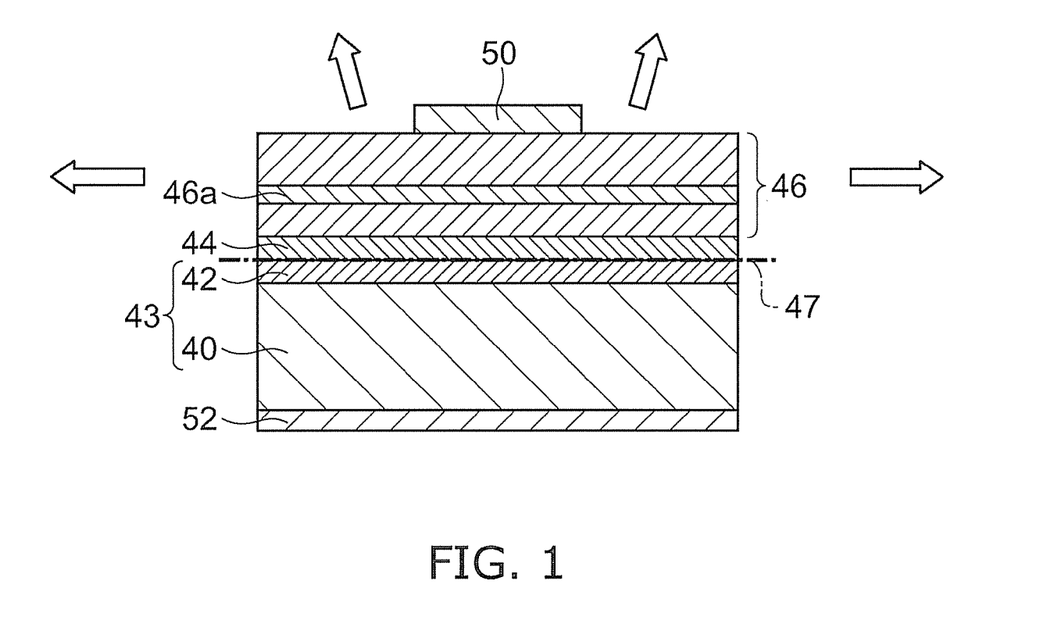
FIG. 1 is a schematic cross-sectional view of a light emitting device according to a first embodiment.

FIG. 1 is a schematic cross-sectional view of a light emitting device according to a first embodiment of the invention.

A second substrate 40 is illustratively made of p-type Si and has a thickness of e.g. 250 µm. However, the substrate is not limited thereto, but can be made of other materials such as Ge and SiC, and the conductivity type can be n-type. The second substrate 40 and a second metal layer 42 provided thereon constitute a second multilayer body 43.

A semiconductor layer 46 made of a compound semiconductor is bonded to the second multilayer body 43 via a first metal layer 44. That is, the first metal layer 44 and the second metal layer 42 are bonded at a bonding interface 47. Here, the first metal layer 44 and the second metal layer 42 can be illustratively made of Ti, Pt, and Au stacked in this order. In this case, the uppermost Au films are bonded to each other.

An upper electrode 50 is provided on the semiconductor layer 46, and a lower electrode 52 is provided on the second substrate 40. The semiconductor layer 46 includes a light emitting layer 46a, from which light is emitted upward and laterally. Light emitted downward from the light emitting layer 46a can be reflected upward or laterally by the first metal layer 44, which serves to increase the brightness. If the light emitting layer 46a is made of InGaAlP-based semiconductors, the emitted light can be in the wavelength range of visible light.

In this specification, the InGaAlP-based semiconductor refers to a material represented by a composition formula $In_x(Ga_yAl_{1-y})_{1-x}P$ (where $0 \leq x \leq 1$, $0 \leq y \leq 1$), and also includes those doped with p-type or n-type impurities.

FIGS. 2A to 2D are process cross-sectional views of a method for manufacturing the light emitting device according to the first embodiment.

Figure 2A:
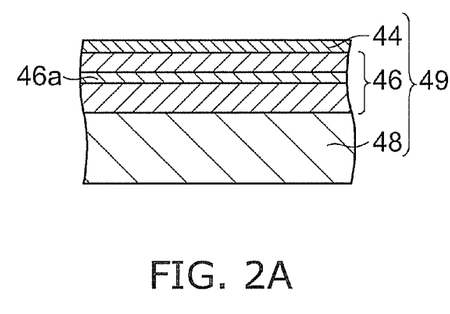
FIGS. 2A to 2D are process cross-sectional views of a method for manufacturing the light emitting device according to the first embodiment.

As shown in FIG. 2A, on a first substrate 48 illustratively made of n-type GaAs, a semiconductor layer 46 including InGaAlP or the like is formed by MOCVD (metal organic chemical vapor deposition) method or MBE (molecular beam epitaxy) method, for instance, and a first metal layer 44 is further formed to construct a first multilayer body 49. If the light emitting layer 46a is made of InGaAlP-based semiconductors, it can emit visible light in the wavelength range from yellow-green to red. Thus, the semiconductor layer 46 illustratively made of InGaAlP is readily lattice-matched with GaAs, and hence can be formed as a good crystal. In contrast, it is difficult to directly form an InGaAlP semiconductor layer on a Si substrate, which has a different lattice constant.

The source material used in the MOCVD method can illustratively be a metal-organic compound such as TMG (trimethylgallium), TMA (trimethylaluminum), and TMI (trimethylindium), or a hydride gas such as arsine ($AsH_3$) and phosphine ($PH_3$). A p-type impurity can illustratively be Zn derived from DMZ (dimethylzinc), and an n-type impurity can illustratively be Si.

Figure 2B:
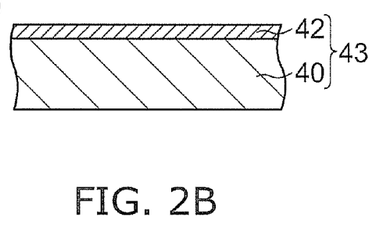

On the other hand, as shown in FIG. 2B, on the second substrate 40 illustratively made of p-type Si, a second metal layer 42 is formed by vacuum evaporation method or the like to construct a second multilayer body 43.

Figure 2C:
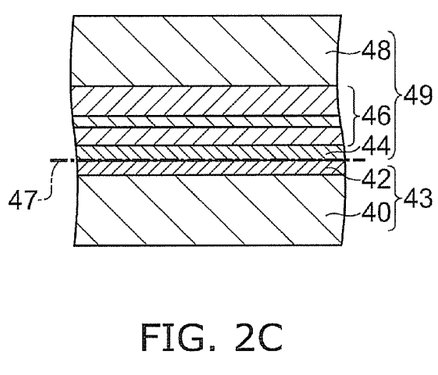

Next, as a first bonding step, the first metal layer 44 and the second metal layer 42 are brought into contact at room temperature, for instance, and heated for generally 30 minutes in the temperature range of 100-200° C., for instance. Thus, as shown in FIG. 2C, the first multilayer body 49 and the second multilayer body 43 are bonded at the bonding interface 47.

Here, the lamination is preferably performed in a vacuum or under low pressure, for instance, because air and the like at the lamination interface can be excluded to achieve closer contact. Furthermore, heating in an inert gas atmosphere or vacuum is more preferable because oxidation of the first and second metal layers 44, 42 can be prevented.

Figure 2D:
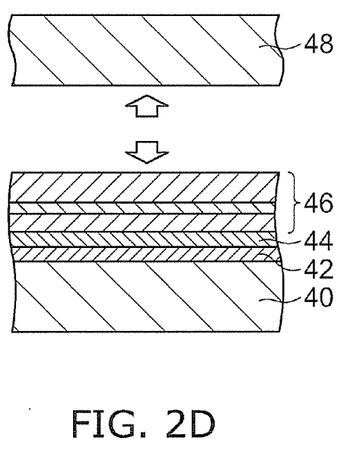

Subsequently, as shown in FIG. 2D, the first substrate 48 is removed by at least one of mechanical polishing method and wet etching method. Here, the first substrate 48 can be completely removed or partly left. Subsequently, as a second bonding step, heating is performed for generally 30 minutes in the temperature range of 300-500° C., for instance, which is higher than the temperature of the first bonding step. The second bonding step is preferably performed in an inert gas atmosphere because oxidation of the first and second metal layer 44, 42 can be prevented. More preferably, the first and second metal layers 44, 42 have a multilayer structure of Ti/Pt/Au, and the first and second bonding steps are performed under a load, because the Au-Au bonding strength can be increased.

Subsequently, an upper electrode 50 and a lower electrode 52 are formed, and ohmic contact is formed between the upper electrode 50 and the semiconductor layer 46, and between the lower electrode 52 and the second substrate 40. Here, the sintering temperature for forming ohmic contact is 350° C., for instance, which is lower than the temperature of the second bonding step. In this case, a stable ohmic contact can be formed between the upper electrode 50 and the semiconductor layer 46, and between the lower electrode 52 and the second substrate 40.

Alternatively, after the process of removing the first substrate 48, an upper electrode 50 and a lower electrode 52 are formed, and a second bonding step for heating to a temperature higher than the temperature of the first bonding step can be performed. In this case, if the temperature of the second bonding step is in the range of 350-500° C., for instance, ohmic contact can be formed while increasing the bonding strength. Thus, the light emitting device shown in FIG. 1 is completed.

Furthermore, in the first bonding step, if the Au or other metal surface to be bonded is irradiated with ions, plasma and the like, unwanted oxide film, organic matter and the like can be removed, and active bonds of atoms can be exposed to the metal surface. That is, the energy required for coupling can be reduced. This is more preferable because it facilitates bonding at a lower temperature. Bonding under an ultrahigh vacuum after the surface activation may allow the wafer to be bonded at a temperature near normal temperature.

In this manufacturing method, the first bonding step is performed at a lower temperature than the second bonding step. Here, it is easy to ensure bonding strength enough to avoid delamination of the semiconductor layer 46, which is an epitaxial layer, in the process of removing the first substrate 48. Furthermore, the second bonding step is performed after the first substrate 48 is removed. The absence of the second bonding step may result in failing to ensure bonding strength enough to withstand the chip separation process. In this embodiment, the second bonding step performed at a higher temperature than the temperature of the first bonding step further increases the bonding strength between the first metal layer 44 and the second metal layer 42, and can prevent chip breakage during the chip separation and assembly process.

Furthermore, wafer cracks, dislocations and the like are reduced at the bonding interface 47, which facilitates achieving device characteristics with improved brightness and reliability. Here, a higher temperature is required to bond a semiconductor layer to a substrate made of a semiconductor, sapphire or the like without the intermediary of a metal layer.

If the second substrate 40 is made of Si, the assembly process can achieve high mass productivity because the substrate has higher strength than that made of GaAs and the like and facilitates chip separation.

FIGS. 3A to 3D are process cross-sectional views of a method for manufacturing a light emitting device according to a comparative example.

Figure 3A:
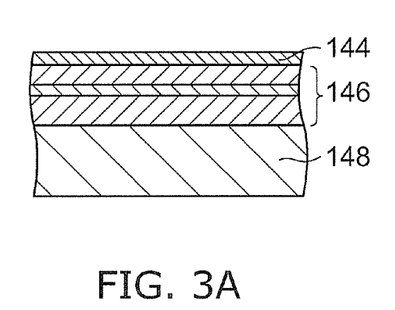
FIGS. 3A to 3D are process cross-sectional views of a method for manufacturing a light emitting device according to a comparative example.

As shown in FIG. 3A, on a first substrate 148 illustratively made of n-type GaAs, a semiconductor layer 146 illustratively made of InGaAlP-based compound semiconductors and a first metal layer 144 are formed by vacuum evaporation method or the like. The first metal layer 144 can be illustratively made of Ti, Pt, and Au stacked in this order from the semiconductor layer 146 side.

Figure 3B:
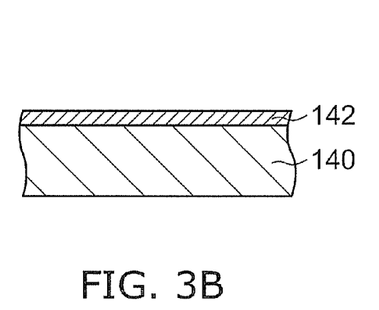

On the other hand, as shown in FIG. 3B, on a second substrate 140 illustratively made of p-type Si, a second metal layer 142 illustratively made of Ti/Pt/Au is formed by vacuum evaporation method or the like.

Figure 3C:
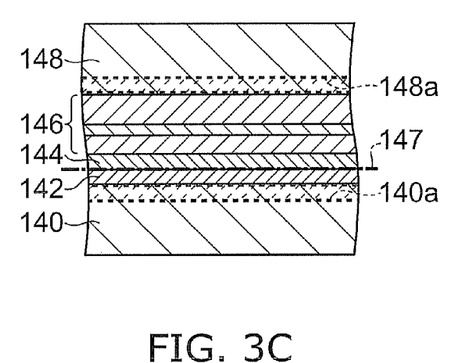

Next, as a bonding step, the first and second metal layers 144, 142 at the surface of these wafers are laminated in a vacuum, for instance, and heated for generally 30 minutes in the temperature range of 300-500° C. in an inert gas atmosphere, for instance. Thus, the two wafers are bonded at a bonding interface 147 (FIG. 3C).

Figure 3D:
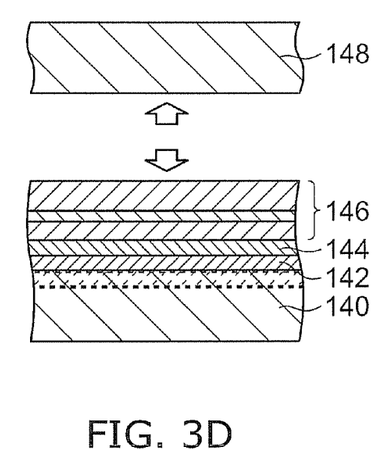

Subsequently, as shown in FIG. 3D, the first substrate 148 is removed by at least one of mechanical polishing and wet etching. Here, the first substrate 148 can be completely removed or partly left. Subsequently, an upper electrode and a lower electrode are formed, and separation into chips is performed.

By way of example, the first substrate 148 was made of GaAs with a diameter of 3 inches and a thickness of 300 μm, and the second substrate 140 was made of Si with a diameter of 3 inches and a thickness of 250 μm. Multilayer bodies including these substrates were laminated together in a vacuum, and heat-treated at generally 300° C. under a load. A warpage of the bonded wafer was measured using a dial gauge. This warpage was 100 μm or less, indicating avoidance of cracks. However, several ten voids having a diameter of several mm occurred.

In general, because of the large thermal expansion coefficient difference between Si and GaAs, a large stress acts between the two substrates during the bonding step including heating. Hence, dislocations and cracks are likely to occur in regions 140a, 148a shown by dotted lines in FIG. 3C. Dislocations and cracks decrease the mechanical strength of the chip, and hence are likely to result in chip breakage during the assembly process. Furthermore, if crystal defects due to dislocations and cracks spread to a light emitting layer 146a, they may decrease the optical output and the like. If the two substrates made of different materials are bonded at a lower heating temperature, the stress can be reduced, but the bonding strength is decreased. Thus, there is a limit to the decrease of the temperature.

Thus, in the comparative example, the bonding temperature is decreased to reduce stress, thereby avoiding cracks. However, voids are difficult to avoid. Typically, to bond wafers made of semiconductors or dielectrics containing no metal, they are heated to e.g. 600° C. or more, which is higher than the temperature for bonding via a metal layer. In this case, impurity atoms such as Zn penetrate into the light emitting layer and the like, and degrade light emission characteristics. In contrast, this embodiment is preferable because the wafers are bonded at 600° C. or less via a metal layer, preventing characteristics degradation. Furthermore, Si can be used for the substrate, which facilitates increasing the mechanical strength. Hence, the mass productivity of the assembly process can be increased.

FIGS. 4A to 4D are process cross-sectional views showing a method for manufacturing a light emitting device according to a second embodiment.

Figure 4A:
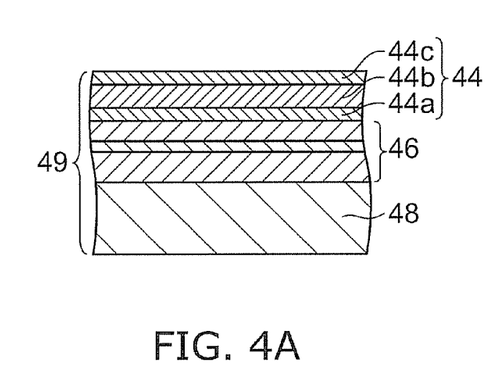
FIGS. 4A to 4D are process cross-sectional views showing a method for manufacturing a light emitting device according to a second embodiment
Figure 4B:
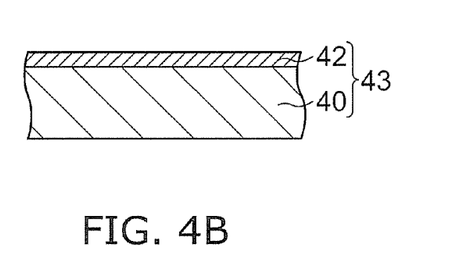
Figure 4C:
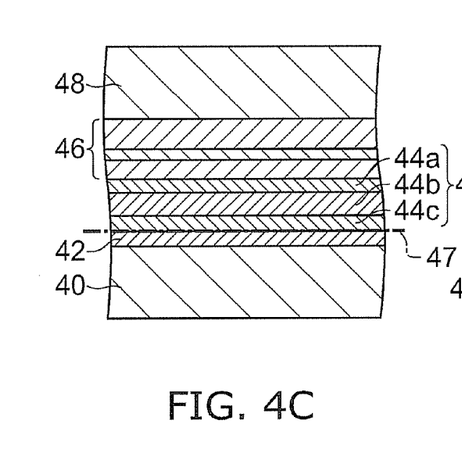

More specifically, the first metal layer 44 of the first multilayer body 49 includes a first metal film 44a illustratively made of Ti/Pt/Au, a second metal film 44b illustratively made of AuSn, and a third metal film 44c illustratively made of Au (FIG. 4A). The third metal film 44c can be omitted, but is preferably provided because it can prevent evaporation of Sn and the like during the lamination process in a vacuum or under low pressure, thereby preventing contamination in the vacuum apparatus.

Figure 4D:
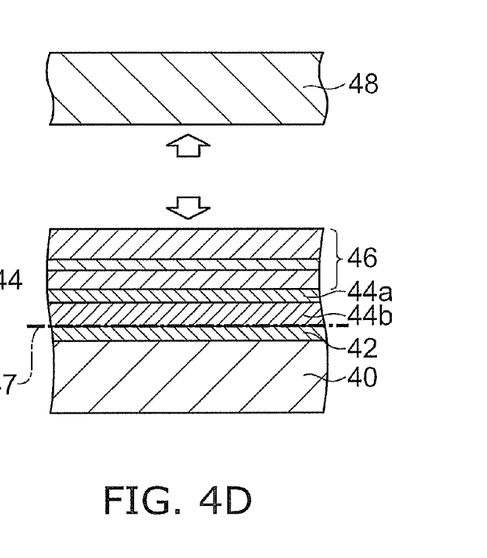

In FIG. 4A, in the case where the second metal film 44b is made of AuSn eutectic solder (the melting point, which is minimized near generally 270° C., can be controlled by its composition ratio), if the temperature of the first bonding step (FIG. 4C) is e.g. 250° C., which is not higher than the melting point, then the bonding strength between the first multilayer body 49 and the second multilayer body 43 is enough to withstand etching of the first substrate 48 made of GaAs. In this case, the first substrate 48 is removed using, for instance, a liquid mixture of sulfuric acid and hydrogen peroxide solution, or ammonia and hydrogen peroxide solution (FIG. 4D).

Subsequently, when the AuSn eutectic solder is melted at e.g. 300° C., the third metal film 44c illustratively made of a thin Au film is melted together with the AuSn eutectic solder, or bonded to Au constituting the second metal layer 42. Thus, the bonding interface 47 can achieve high bonding strength free from voids. Here, if the first and second bonding steps are performed in an inert gas atmosphere, oxidation of the first metal layer 44 and the second metal layer 42 can be prevented. Furthermore, the bonding strength can be further increased by applying a load. In this embodiment, in the temperature decreasing process of the second bonding step, the first substrate 48 illustratively made of GaAs has already been removed. Hence, the second substrate 40 illustratively made of Si undergoes no stress from GaAs, which facilitates avoiding cracks and dislocations.

By way of example, the second substrate 40 was a Si substrate with a diameter of 3 inches and a thickness of 250 μm, and the first substrate 48 was a GaAs substrate with a diameter of 3 inches and a thickness of 300 μm. The first multilayer body 49 and the second multilayer body 43 were bonded by heating to 300° C. in the laminated state. A warpage of the wafer measured in this case was as large as 300-400 μm, and cracks occurred in the Si wafer. This is attributed to the stress due to the thermal expansion coefficient difference, caused by the temperature difference between room temperature and approximately 300° C. at which AuSn is melted. That is, in the bonding process using AuSn eutectic solder, atoms at the bonding interface are fixed at the melting point or a slightly lower temperature, increasing the stress in the process of cooling to room temperature. Thus, it was found that this bonding process is more likely to cause cracks than Au—Au bonding.

The thermal expansion coefficient (or thermal expansion rate) at 300 K is $2.4 \times 10^{-6}$/K for Si, which is smaller than $6.4 \times 10^{-6}$/K for GaAs and $14.2 \times 10^{-6}$/K for Au. Hence, a compressive stress is applied to the Si substrate in the temperature decreasing process from the melting point to room temperature. That is, if the temperature of bonded substrates made of different materials is decreased from generally 300° C. to room temperature, a compressive stress is applied to the substrate having a smaller thermal expansion coefficient, which is undesirable because cracks are likely to occur therein. In this embodiment, the first bonding step is performed at a temperature lower than generally 270° C., which is the melting point of AuSn solder. Then, after the GaAs substrate is removed to allow stress reduction, the temperature is increased to above the melting point. Hence, while the stress applied to the Si substrate is reduced, melting of AuSn solder prevents voids, increasing the bonding strength.

Examples of the eutectic solder include AuGe (melting point generally 356° C.) and AuSi (melting point generally 370° C.), and examples of the low-melting-point metal include In (melting point generally 156° C.). These metals can also be used.

Light directed downward from the light emitting layer can be reflected upward or laterally by the first metal film 44a, which facilitates increasing the brightness.

FIGS. 5A to 5D are process cross-sectional views of a light emitting device according to a variation of the second embodiment.

Figure 5A:
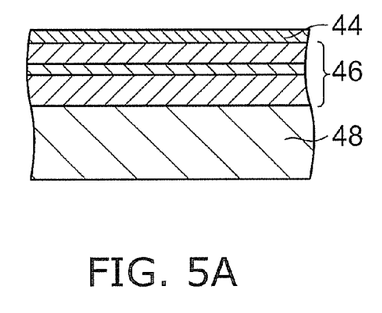
FIGS. 5A to 5D are process cross-sectional views of a light emitting device according to a variation of the second embodiment.
Figure 5B:
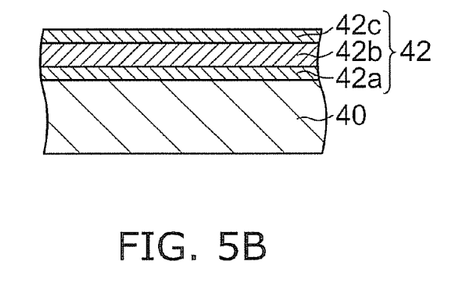
Figure 5C:
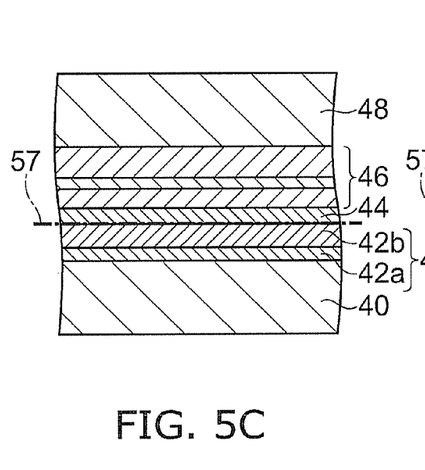
Figure 5D:
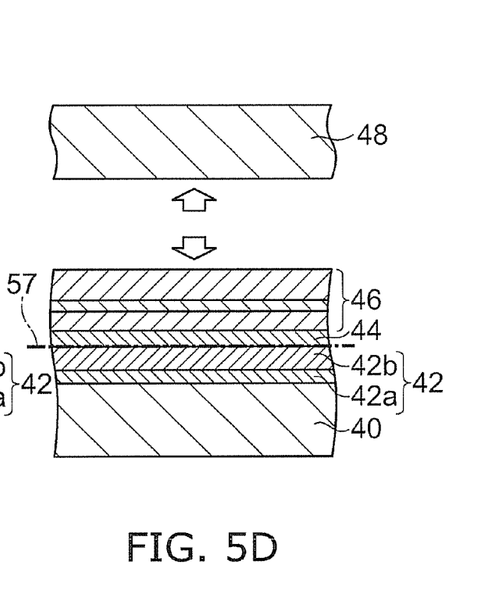

As shown in FIG. 5A, the first metal layer 44 on the semiconductor layer 46 has a structure of, for instance, Ti/Pt/Au stacked in this order. On the other hand, as shown in FIG. 5B, the metal layer 42 on the second substrate 40 includes a first metal film 42a illustratively made of Ti/Pt/Au, a second metal film 42b illustratively made of AuSn, and a third metal film 42c illustratively made of Au. As shown in FIG. 5C, these are laminated and bonded at a bonding interface 57 by the first bonding step. Subsequently, the first substrate 48 is removed, and the second bonding step is further performed. As in this variation, a solder layer illustratively made of AuSn can be provided on the second substrate 40 side. Furthermore, a solder layer illustratively made of AuSn can be provided on both the first and second substrates 48, 40 to bond them together.

Figure 6:
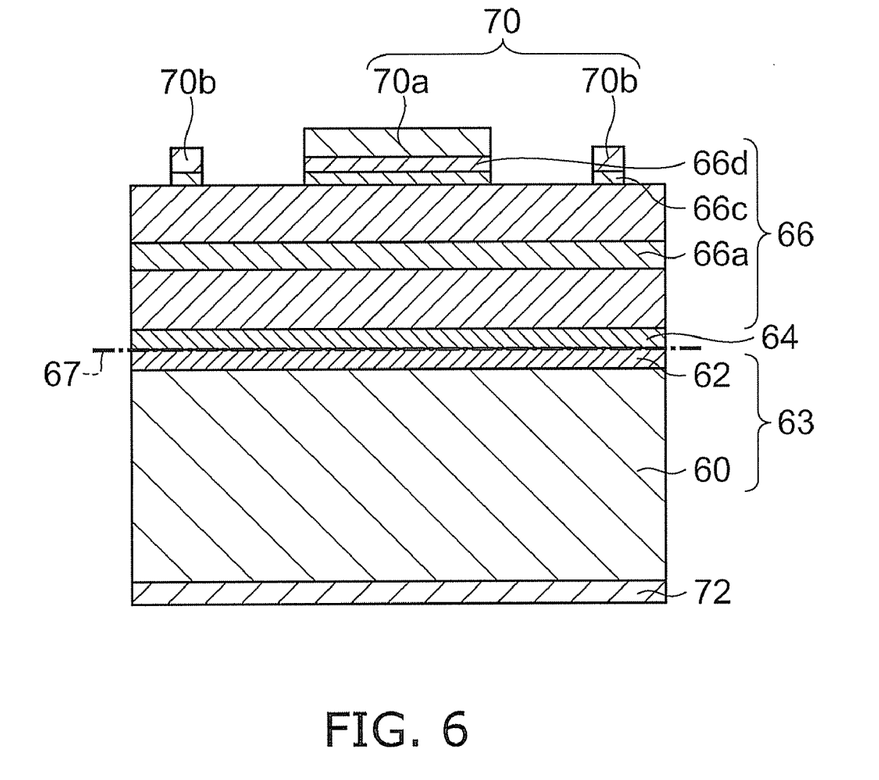
FIG. 6 is a schematic cross-sectional view of a light emitting device according to a third embodiment.

FIG. 6 is a schematic cross-sectional view of a light emitting device according to a third embodiment.

FIGS. 7A to 7D are process cross-sectional views showing a method for manufacturing the light emitting device of the third embodiment.

A second multilayer body 63 includes a second substrate 60 illustratively made of p-type Si and a second metal layer 62. A first multilayer body 69 includes a first substrate 68 illustratively made of sapphire, a semiconductor layer 66 provided on the first substrate 68, and a first metal layer 64. The second metal layer 62 and the first metal layer 64 are bonded at a bonding interface 67. The semiconductor layer 66 is made of InGaAlN-based semiconductors, and a light emitting layer 66a can emit light having a wavelength near blue, for instance.

In this specification, the InGaAlN-based semiconductor refers to a semiconductor represented by a composition formula $In_xGa_yAl_{1-x-y}N$ ($0 \leq x \leq 1$, $0 \leq y \leq 1$, $x+y \leq 1$), and also includes those doped with impurities for controlling the conductivity type.

An upper electrode 70 is provided on an upper surface of the semiconductor layer 66, and a lower electrode 72 is provided on a rear surface of the second substrate 60. Light from the light emitting layer 66a can be emitted laterally, as well as from the upper surface of the semiconductor layer 66 outside the upper electrode 70.

Figure 7A:
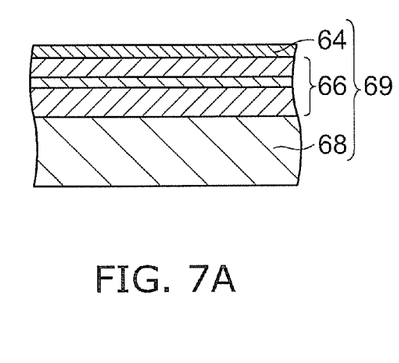
FIGS. 7A to 7D are process cross-sectional views showing a method for manufacturing the light emitting device of the third embodiment.

In FIG. 7A, the semiconductor layer 66 is formed by MOCVD or MBE method, for instance, on the first substrate 68 illustratively made of sapphire with a thickness of e.g. 250 μm. The material used in the MOCVD method is a metal-organic compound such as TMG, TMA, and TMI, or a gas such as ammonia. The p-type impurity can be Mg, and the n-type impurity can be Si. The Mg source can be bis(cyclopentadienyl)magnesium, and the Si source can be silane.

In the semiconductor layer 66, a buffer layer made of AlN is grown on the first substrate 68 at generally 500° C. Continuously, at generally 1000° C., a GaN current block layer 66d (0.2 μm thick), an n-type GaN contact layer 66c (0.5 μm thick), an n-type GaN current diffusion layer (1.5 μm thick), an n-type InGaAlN cladding layer (0.6 μm thick), the light emitting layer 66a (0.1 μm thick), a p-type InGaAlN cladding layer (0.3 μm thick), and a p-type GaN contact layer are formed by crystal growth in this order. The composition of the light emitting layer 66a is suitably controlled so that the emission wavelength falls within the range from blue to green. The first metal layer 64 illustratively made of Ti/Pt/Au, Ni/Au, Al or an alloy thereof, or Ag or an alloy thereof is formed by vacuum evaporation or the like.

Figures 7B, 7D:
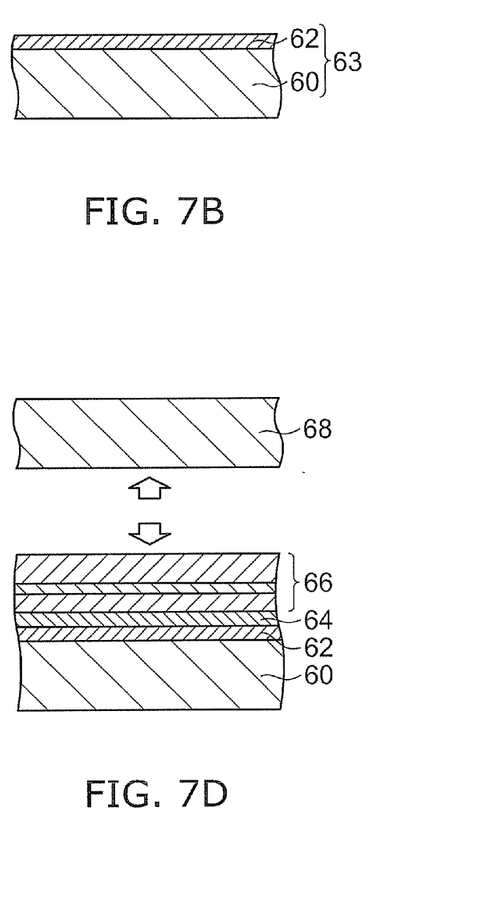
Figure 7C:
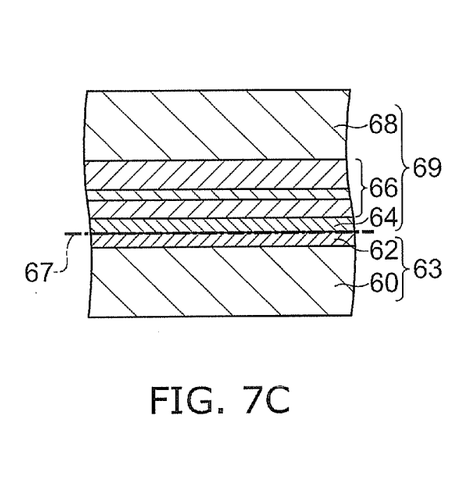

On the other hand, the second substrate 60 illustratively made of p-type Si is formed by vacuum evaporation method or the like, and includes the second metal layer 62 illustratively made of Ti/Pt/Au (FIG. 7B). The second metal layer 62 and the first metal layer 64 are bonded at the bonding interface 67 by the first bonding step in which they are laminated at room temperature, for instance, and heated for 30 minutes at 100-200° C. in an inert gas (FIG. 7C).

Subsequently, the first substrate 68 is removed using at least one of laser lift-off method and mechanical polishing method. In the laser lift-off method, by irradiation with laser light from the first substrate 68 side, GaN constituting the semiconductor layer 66 is decomposed into Ga and N at the interface between the first substrate 68 and the semiconductor layer 66. The decomposed N is vaporized and increases its volume, allowing the first substrate 68 side to be removed (FIG. 7D). Subsequently, as the second bonding step, heating is performed in an inert gas atmosphere for 30 minutes at 400-500° C., which is higher than the temperature of the first bonding step. More preferably, the first and second bonding steps are performed under a load, because the bonding strength can be increased. Furthermore, the upper electrode 70 and the lower electrode 72 are formed, and separation into chips is performed. Thus, the light emitting device of FIG. 6 is completed. Here, the upper electrode 70 includes a bonding electrode 70a and a thin wire electrode 70b.

The bonding electrode 70a and the thin wire electrode 70b are electrically connected, allowing a current to be injected into the light emitting layer 66a through a bonding wire via the bonding electrode 70a and the thin wire electrode 70b. On the other hand, the GaN current block layer 66d is provided between the bonding electrode 70a and the n-type GaN contact layer 66c, and hence no current is injected therethrough. Hence, light emission is prevented in the portion of the light emitting layer 66a below the bonding electrode 70a. Thus, decrease in light extraction efficiency due to light blocking by the bonding electrode 70a can be prevented. Furthermore, light emitted downward from the light emitting layer 66a can be reflected upward or laterally by the first metal layer 64, which facilitates increasing the brightness.

According to this embodiment, the temperature of the first bonding step is as low as in the range of 100-200° C. This serves to reduce the stress applied to the substrate in the temperature decreasing process, thereby avoiding cracks and dislocations. Furthermore, in the second bonding step, the first substrate 68 illustratively made of sapphire has been removed. This serves to reduce voids and achieve high bonding strength while avoiding cracks and dislocations in the temperature decreasing process after bonding at a higher temperature. Thus, the reliability of the light emitting device is improved. In this embodiment, if the second substrate 60 is made of Si, chip separation and the assembly process subsequent thereto are made easier than those for the chip including a substrate made of sapphire or GaN (for which the wafer diameter is difficult to increase). Thus, the mass productivity of blue-green light emitting devices can be increased.

Figure 8:
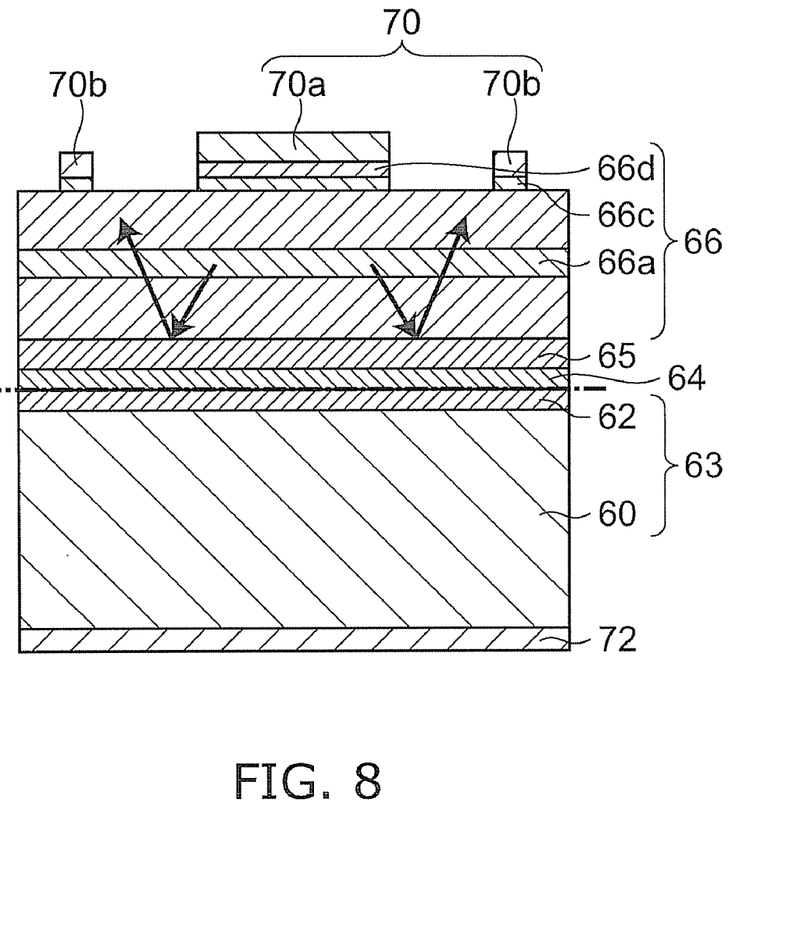
FIG. 8 is a schematic cross-sectional view showing a light emitting device according to a variation of the third embodiment.

FIG. 8 is a schematic cross-sectional view showing a light emitting device according to a variation of the third embodiment.

A transparent electrode 65 made of ITO (indium tin oxide) or ZnO and being conductive is provided between first metal layer 64 and the semiconductor layer 66. If the first metal layer 64 includes Au, AuGe and the like, it is likely to form an alloy layer with the semiconductor layer 66. This alloy layer absorbs emitted light and decreases the optical reflectance. In contrast, if the transparent electrode 65 is provided, it can prevent alloying and the decrease of optical reflectance associated therewith, and facilitates maintaining high light extraction efficiency.

The first to third embodiments can provide methods for manufacturing a light emitting device with reduced stress at the wafer bonding interface and improved brightness and reliability. These manufacturing methods can achieve high mass productivity in providing a light emitting device being applicable to illumination devices, display devices and the like, and having high brightness and high reliability.

The embodiments of the invention have been described with reference to the drawings. However, the invention is not limited to these embodiments. Those skilled in the art can variously modify the material, size, shape, layout, bonding condition and the like of the substrate, semiconductor layer, metal layer, multilayer body, electrode and the like constituting the embodiments of the invention, and such modifications are also encompassed within the scope of the invention unless they depart from the spirit of the invention.

The invention claimed is:

1. A method for manufacturing a light emitting device, comprising:
   forming a first multilayer body including a first substrate, a first semiconductor layer provided on the first substrate and having a light emitting layer, and a first metal layer provided on the first semiconductor layer;
   forming a second multilayer body including a second substrate having a thermal expansion coefficient different from a thermal expansion coefficient of the first substrate, and a second metal layer provided on the second substrate;
   a first bonding step configured to heat the first metal layer and the second metal layer being in contact with each other;
   removing the first substrate after the first bonding step; and
   a second bonding step configured to perform heating after the removing,
   one of the first metal layer and the second metal layer including a metal film having a melting point not higher than a temperature of the second bonding step, but higher than a temperature of the first bonding step, and
   the second bonding step including bonding the first metal layer and the second metal layer by melting the metal film.

2. A method for manufacturing a light emitting device, comprising:
   forming a first multilayer body including a first substrate made of one of GaAs, GaP, and SiC, a first semiconductor layer provided on the first substrate and having a light emitting layer, and a first metal layer provided on the first semiconductor layer;
   forming a second multilayer body including a second substrate having a thermal expansion coefficient different from a thermal expansion coefficient of the first substrate and made of one of Si, Ge, and SiC, and a second metal layer provided on the second substrate;
   a first bonding step configured to heat the first metal layer and the second metal layer being in contact with each other;
   removing the first substrate after the first bonding step; and
   a second bonding step configured to perform heating after the removing,
   one of the first metal layer and the second metal layer including a metal film having a melting point not higher than a temperature of the second bonding step, but higher than a temperature of the first bonding step, and
   the second bonding step including bonding the first metal layer and the second metal layer by melting the metal film.

3. The method according to claim 2, wherein the second bonding step includes forming a first electrode on the first semiconductor layer and forming a second electrode on the second substrate, followed by heating at the temperature higher than the temperature of the first bonding step.

4. The method according to claim 3, wherein the temperature in the second bonding step allows ohmic contact to be formed between the first semiconductor layer and the first electrode, and between the second substrate and the second electrode, respectively.

5. The method according to claim 2, wherein the removing includes using at least one of mechanical polishing method and wet etching method.

6. The method according to claim 2, wherein
   the first metal layer includes a first Au film at its surface, and
   the second metal layer includes a second Au film at its surface.

7. The method according to claim 6, wherein the first metal layer further includes a first Ti film provided adjacent to the first semiconductor layer and a first Pt film provided between the first Ti film and the first Au film, or further includes an Ni film provided between the first semiconductor layer and the first Au film.

8. The method according to claim 6, wherein the second metal layer further includes a second Ti film provided adjacent to the second substrate and a second Pt film provided between the second Ti film and the second Au film.

9. The method according to claim 2, wherein
   the metal film includes a solder layer.

10. The method according to claim 9, wherein the solder layer includes at least one of AuSn, AuGe, AuSi, and In.

11. A method for manufacturing a light emitting device, comprising:
   forming a first multilayer body including a first substrate made of sapphire, a first semiconductor layer provided on the first substrate and having a light emitting layer, and a first metal layer provided on the first semiconductor layer;
   forming a second multilayer body including a second substrate having a thermal expansion coefficient different from a thermal expansion coefficient of the first substrate and made of one of Si, Ge, and SiC, and a second metal layer provided on the second substrate;
   a first bonding step configured to heat the first metal layer and the second metal layer being in contact with each other;
   removing the first substrate after the first bonding step; and
   a second bonding step configured to perform heating after the removing,
   one of the first metal layer and the second metal layer including a metal film having a melting point not higher than a temperature of the second bonding step, but higher than a temperature of the first bonding step, and the second bonding step including bonding the first metal layer and the second metal layer by melting the metal film.

12. The method according to claim 11, wherein the forming the first multilayer body includes forming the first semiconductor layer represented by a composition formula $In_xGa_yAl_{1-x-y}N$ ($0 \leq x \leq 1$, $0 \leq y \leq 1$, $x+y \leq 1$).

13. The method according to claim 12, wherein the removing includes using at least one of laser lift-off method and mechanical polishing method.

14. The method according to claim 11, wherein the forming the first multilayer body includes forming a transparent electrode between the first semiconductor layer and the first metal layer.

15. The method according to claim 11, wherein
the first metal layer includes a first Au film at its surface, and
the second metal layer includes a second Au film at its surface.

16. The method according to claim 15, wherein the first metal layer further includes a first Ti film provided adjacent to the first semiconductor layer and a first Pt film provided between the first Ti film and the first Au film, or includes an Ni film provided between the first semiconductor layer and the first Au film.

17. The method according to claim 15, wherein the second metal layer further includes a second Ti film provided adjacent to the second substrate and a second Pt film provided between the second Ti film and the second Au film.

18. The method according to claim 11, wherein
the metal film includes a solder layer.

19. The method according to claim 18, wherein the solder layer includes at least one of AuSn, AuGe, AuSi, and In.

* * * * *